(12) United States Patent
Gupta

(10) Patent No.: US 11,096,314 B2
(45) Date of Patent: Aug. 17, 2021

(54) FRONT ACCESSIBLE FAN TRAY WITH FRONT-TO-BACK COOLING IN A MODULAR ELECTRONIC SYSTEM

(71) Applicant: CISCO TECHNOLOGY, INC., San Jose, CA (US)

(72) Inventor: Rohit Dev Gupta, Bangalore (IN)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/030,527

(22) Filed: Jul. 9, 2018

(65) Prior Publication Data

US 2020/0015386 A1 Jan. 9, 2020

(51) Int. Cl.
| | |
|---|---|
| *H05K 7/20* | (2006.01) |
| *H05K 7/16* | (2006.01) |
| *H05K 7/14* | (2006.01) |
| *H04B 10/40* | (2013.01) |

(52) U.S. Cl.
CPC ....... *H05K 7/20581* (2013.01); *H05K 7/1401* (2013.01); *H05K 7/16* (2013.01); *H04B 10/40* (2013.01)

(58) Field of Classification Search
CPC .. H05K 7/16; H05K 7/20181; H05K 7/20581; H05K 7/1401; H05K 10/40; H04B 10/40
See application file for complete search history.

(56) References Cited

U.S. PATENT DOCUMENTS

| | | | |
|---|---|---|---|
| 6,822,859 B2 | 11/2004 | Coglitore et al. | |
| 6,896,611 B2 * | 5/2005 | Giraldo | H05K 7/20172 361/695 |
| 7,639,486 B2 | 12/2009 | Champion et al. | |
| 7,826,222 B2 | 11/2010 | Aybay et al. | |
| 9,204,576 B2 | 12/2015 | Goulden et al. | |
| 9,253,927 B1 * | 2/2016 | Kull | H05K 7/20581 |
| 9,462,710 B2 * | 10/2016 | Karandikar | H02B 13/025 |
| 9,661,787 B2 | 5/2017 | Hall et al. | |
| 2001/0024358 A1 * | 9/2001 | Bonet | H05K 7/20581 361/695 |
| 2013/0216365 A1 * | 8/2013 | Dalgaard | F04D 25/166 415/182.1 |
| 2014/0178079 A1 * | 6/2014 | Yagisawa | G02B 6/4246 398/139 |
| 2015/0216069 A1 * | 7/2015 | Hori | H05K 7/20727 361/679.48 |
| 2016/0327062 A1 * | 11/2016 | Amin-Shahidi | H05K 7/20181 |
| 2016/0381836 A1 * | 12/2016 | Hall | H05K 7/20718 361/679.48 |
| 2017/0112024 A1 * | 4/2017 | Sato | H05K 7/14 |
| 2018/0376614 A1 * | 12/2018 | Xiong | H05K 7/20181 |

* cited by examiner

*Primary Examiner* — James Wu
*Assistant Examiner* — Hung Q Dang
(74) *Attorney, Agent, or Firm* — Cindy Kaplan

(57) ABSTRACT

In one embodiment, a modular electronic system includes a front panel comprising openings for receiving a plurality of modules, a removable fan tray comprising a plurality of fans for cooling one or more of the modules with airflow entering the modular electronic system at the front panel when the plurality of fans are operating, and a fan tray channel for receiving the fan tray and positioning the fans in a row generally parallel to the front panel. The channel extends from one of the openings in the front panel and is contained within a horizontal plane in the modular electronic system.

19 Claims, 20 Drawing Sheets

FRONT ACCESSIBLE FAN TRAY WITH FRONT-TO-BACK COOLING IN A MODULAR ELECTRONIC SYSTEM

TECHNICAL FIELD

The present disclosure relates generally to network communications devices, and more particularly, to cooling for modular electronic systems.

BACKGROUND

Modular electronic systems are designed to provide flexibility to configure systems as per user needs. These systems typically have multiple slots to accommodate a variety of modules. Small form factor electronic systems are often designed with cooling that provides side-to-side air flow to enable field replaceable units to be front accessible. As optical power dissipation increases, cooling of optical modules becomes more difficult and side-to-side airflow may not provide sufficient cooling.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
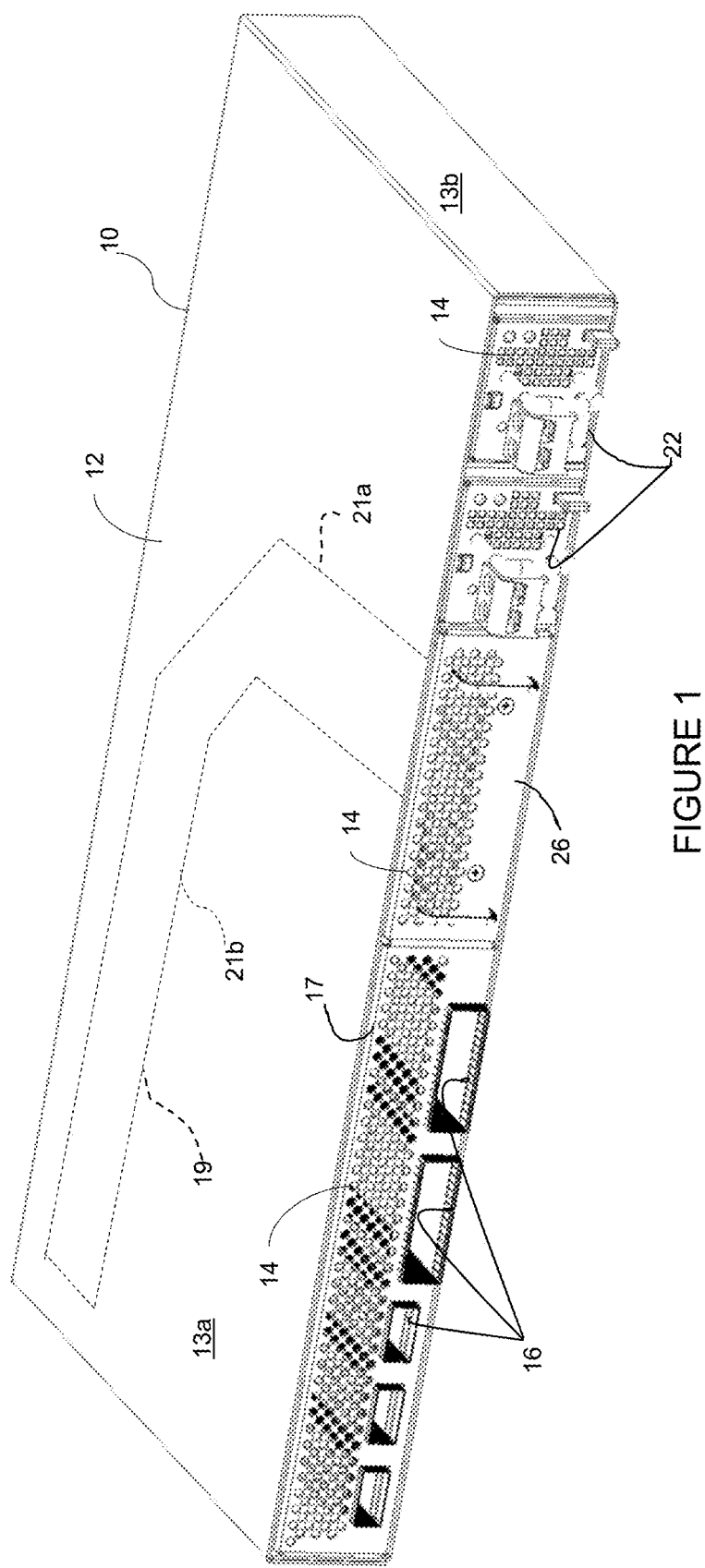
FIG. 1 is a perspective of a modular electronic system illustrating a location of a flexible fan tray, in accordance with one embodiment.

In one embodiment, a modular electronic system generally comprises a front panel comprising openings for receiving a plurality of modules, a removable fan tray comprising a plurality of fans for cooling one or more of the modules with airflow entering the modular electronic system at the front panel when the plurality of fans are operating, and a fan tray channel for receiving the fan tray and positioning the fans in a row generally parallel to the front panel. The channel extends from one of the openings in the front panel and is contained within a horizontal plane in the modular electronic system.

In another embodiment, an apparatus generally comprises a fan tray comprising a plurality of fans for cooling modules within a modular electronic system with airflow from a front of the modular electronic system to a back of the modular electronic system and a hinge member for connecting the fan tray to a front panel of the modular electronic system with the fans positioned in front of the modules. The fan tray is rotatable on the hinge member for movement away from the front panel to allow for replacement of one of the modules.

In yet another embodiment, a modular electronic system generally comprises a chassis for supporting a plurality of optical modules, a front panel comprising openings for receiving the optical modules, at least one power supply unit, and a flexible fan tray, and a path located in a horizontal plane of the chassis and comprising a first portion extending from one of the openings in the front panel and a second portion extending generally parallel to the front panel. The path is configured for receiving the flexible fan tray comprising a plurality of fans for cooling the optical modules with airflow from a front of the modular electronic system towards a back of the modular electronic system when the fans are positioned in the second portion of the path.

Further understanding of the features and advantages of the embodiments described herein may be realized by reference to the remaining portions of the specification and the attached drawings.

Example Embodiments

The following description is presented to enable one of ordinary skill in the art to make and use the embodiments.

Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network devices such as switches, routers, servers, or other electronic devices may be configured as a modular electronic system with a plurality of removable modules (e.g., service cards, line cards, optical modules, fabric cards, power supply units (PSUs), fans (fan trays), filters, or other cards, components, or modules), which may provide power, cooling, networking, interconnect functions, management capabilities, etc. The modular electronic system may be installed, for example, in the front end of an equipment rack or cabinet, with any number of modular electronic systems installed above or below within the rack or cabinet. The rack or cabinet may be located between a cold aisle with cold air and a hot aisle with hot air. The cold aisle may be where the air conditioning unit provides cold air, for example. In an air-cooled modular electronic system, cooling air is supplied to each of the modules to maintain a normal cool state of each module. Small form factor (e.g., 1 RU (rack unit) or 2 RU) modular electronic systems, which may also be referred to as a "pizza box" form factor, are typically designed with side-to-side airflow as it enables all of the field replaceable parts to be front accessible. This side-to-side airflow, when deployed in a closed cabinet has several drawbacks, such as recirculation of hot air (both inlet and exhaust in hot aisle). Cooling of components such as high power optical transceivers using side-to-side airflow has become very challenging.

Front-to-back airflow provides an air inlet at a cold aisle and provides uniform airflow distribution across all optical transceivers, thereby improving the cooling efficiency of the equipment. In order to achieve front-to-back airflow, fan trays are typically assembled at the back of the equipment. However, this creates a major deployment restriction, which requires rear accessibility in order to replace the fans following a failure. Thus, while front-to-back airflow is desired to achieve thermal performance, it is also desired to have all components be front accessible so that the equipment can be deployed in a closed cabinet, including back-to-back deployment arrangements or cabinets/racks installed against a wall. Meeting these requirements in a small (pizza box) form factor has been very challenging.

The embodiments described herein provide front-to-back airflow to enable uniform flow distribution and provide improved cooling of components such as high power optical transceivers, with front accessible field replaceable units to allow the equipment to be installed in a closed cabinet or a rack installed against a wall. The embodiments allow for front-to-back cooling with the front of a chassis, where the air intakes are located, facing a cold aisle. Cooling air may enter the front of the rack from a cold aisle and exit through the rear of the rack into a hot aisle, for example. The embodiments also allow for back-to-back deployment of equipment.

Referring now to the drawings, and first to FIG. 1, an example of a modular electronic system (network device, small form factor (pizza box form factor), equipment) 10 that may implement the embodiments described herein is shown. The modular electronic system 10 may operate, for example, as a switch, router (e.g., Cisco ASR (Aggregation Services Router) 9000 series), server, network convergence system (e.g., Cisco NCS (Network Convergence System) 1000 series), or any other network device comprising modules (components, cards, trays, elements, units) included in modular sections. In one or more embodiments, the network device 10 operates in a data communications network including multiple network devices that may communicate over one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet, intranet, radio access network, public switched network, or any other network).

The modular electronic system 10 shown in FIG. 1 comprises a plurality of modules (e.g., power supply units 22, fan tray 26) and openings 16 for receiving modules, contained within a frame (chassis) 12. As previously noted, the small form factor and shape of the chassis (e.g., wide and flat, 1 RU, 2 RU), which is typically horizontally placed, may be referred to as a pizza-box form factor The system 10 may include one or more frames or structures 12 comprising a top wall 13a, bottom wall (not shown), side walls 13b, front panel 17, and rear panel (not shown) and configured to support various components and slidably receive any number of removable modules. The example shown in FIG. 1 includes two power supply units 22, flexible fan tray 26, and openings 16 for receiving optical modules (transceivers) or port/cable connectors. The modular electronic system (network device) 10 may be mounted in a rack system (e.g., two or four post rack mounting system with slider brackets) or a cabinet configured to support a plurality of network devices attached to the rack or cabinet with support brackets (not shown).

The term module as used herein refers to any module, component, or field replaceable unit of the modular electronic system, including, for example, optical modules (transceivers), line cards, controller cards, fabric cards, service cards, combo cards, fan trays, power supply units, filters, and the like. In one example, the module comprises an optical module, which may comprise a pluggable transceiver module in any form factor (e.g., SFP (Small Form-Factor Pluggable), QSFP (Quad Small Form-Factor Pluggable), QSFP-DD (e.g., QSFP-DD with 15 W of power), CFP (C Form-Factor Pluggable), CXP, and the like). A cable connected to the module may carry, for example, data (e.g., Ethernet, fiber optics, optical array, fabric), power, or both data and power.

As described in detail below, the flexible fan tray 26 is received at a front facing opening in the front panel 17 of the modular electronic system 10. The flexible fan tray 26 is inserted along an internal channel (path) indicated at dashed lines 19 on the top wall 13a of the modular electronic system 10. The channel 19 includes a first portion 21a extending generally perpendicular to the front panel 17 for receiving the fan tray and a second portion 21b extending generally parallel to the front panel 17 for positioning the fans behind the optical modules for cooling of the optical modules with front-to-back airflow. In one or more embodiments, the first portion 21a of the channel 19 is interposed between components (e.g., power supply 22, optical modules) of the modular electronic system 10 and the fan tray channel located entirely within a horizontal plane generally coplanar with the components. This arrangement allows the fans to be positioned behind the optical modules, thereby providing front-to-back airflow through the device. It is to be understood that the term "horizontal plane" as used herein refers to a plane contained within the modular electronic system and if the modular electronic system were placed vertically rather than horizontally, the term would refer to a plane contained within the modular electronic system (i.e., plane generally parallel to the top surface 13a and bottom surface of the modular electronic system and contained within the chassis).

The term "channel" as used herein refers to a path or clearance space (area) that the fan tray is free to travel through in the chassis. There may be any number of components adjacent to the channel. For example, in one or more embodiments, a PCB may be located below the channel or path. The channel or path may be defined, for example, by a top wall, bottom wall, side wall, or any combination thereof. As previously noted, the channel is contained within a horizontal plane within the modular electronic system. The channel (path, first portion) provides space for the flexible fan tray and fans mounted on the fan tray to pass through the modular electronic system and may be open on one or more sides. The channel (path, second portion) provides space for the fans to be positioned during operation. As described in detail below, the fan tray may slide along a fan tray guide attached to a bottom wall, top wall, side wall (or any combination thereof) within the channel. In one or more embodiments, the fan tray may be spaced from a PCB on a bottom wall of the chassis (i.e., slide along a fan tray guide on a side wall or top wall of the channel) thereby providing additional PCB space.

In the example shown in FIG. 1, the front panel 17 of the chassis 10 along with front panels of the fan tray 26 and power supply units 22 include openings 14 (air vents) to allow air flow into the chassis, as described below. A back panel of the chassis 10 (not shown) may also include air vents to allow for front-to-back air flow through the chassis.

It is to be understood that the type, number, and arrangement of components and modules or openings shown and described herein are only examples and the modular electronic system may include any number or type of modules arranged in any format, with any size or shape chassis, without departing from the scope of the embodiments.

Figure 2:
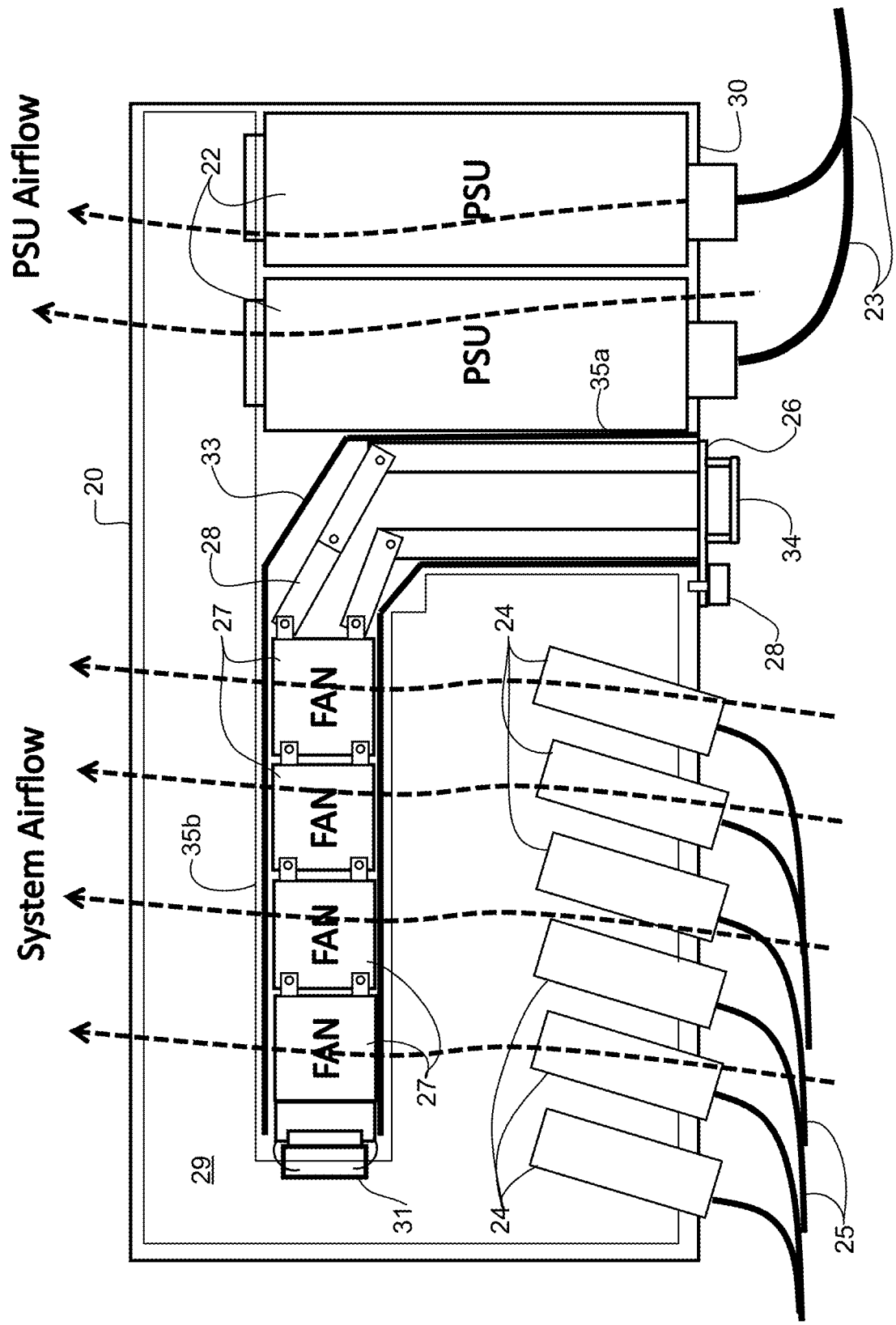
FIG. 2 is top view of the modular electronic system and flexible fan tray with part of a chassis removed to show detail.

FIG. 2 is a top view of a modular electronic system 20 with the flexible fan tray 26 installed, in accordance with one embodiment. A top portion of the chassis is removed to show details inside of the modular electronic system 20. In this example, the modular electronic system 20 comprises two power supply units (PSUs) 22 and six optical modules (e.g., optical transceivers) 24. Each of the PSUs 22 is connected to a cable 23 providing electrical power and each of the optical modules 24 is connected to a cable (optical fiber) 25 for communicating optical data. The fan tray 26 comprises a plurality of fans 27 and is inserted into a channel 33 located in a horizontal plane generally coplanar with the optical modules 24. As shown in FIG. 2, the fan tray 26 is positioned within the same plane in which it is inserted, at a location behind the optical modules 24 (in a row generally parallel to front panel 30) to cool the optical modules with air flowing from a front side of the modular electronic system 20 towards a back side of the system (front-to-back airflow) as indicated by the arrows labeled system airflow in FIG. 2. The power supply modules 22 may be cooled by separate internal fans (not shown), which may provide airflow in the front-to-back direction, for example, as indicated by the arrows labeled PSU airflow in FIG. 2. A PCB (printed circuit board 29) may include a cutout configured based on the layout and the fan position for optimized cooling. The fan tray 26 is inserted into a front end of the channel 33 in an opening in the front panel 30. The flexible fan tray 26 is front accessible, with all individual fans 27 connected in series through hinged joints 28 (described further below with respect to FIG. 4).

A fan tray guide (shown in FIGS. 7 and 8, and described below), which is located within the channel 33 (and may define the channel) is internal to the modular electronic system (equipment) 20 and guides the fan tray 26 through a ninety degree turn so that all individual fans are positioned generally parallel to the front panel 30. The fan tray channel 33 comprises two generally perpendicular channels or portions, as described above with respect to FIG. 1. A first portion 35a extends from an opening in the front panel 30, generally perpendicular to the front panel for insertion of the fan tray 26 and a second portion 35b extends generally perpendicular to the first portion for positioning the fans 27 in their operating location, generally parallel to the front panel 30. As previously noted, this arrangement enables front-to-back airflow within the equipment with uniform distribution across all of the optical modules 24. It is to be understood that the footprint of the channel 33 shown in FIG. 2 is only an example and other configurations may be used. For example, the first portion may be offset or angled relative to the front panel 30, as long as it allows access to position the fans behind the optical modules 24.

In one embodiment, a fan tray connector 31 is located at a leading edge of the fan tray 26 to provide electrical power to the fan tray. The fan tray connector 31 may be used to provide power to the fan tray and communications signaling to a fan controller or one or more indicator lights (e.g., LED (light emitting diode)) on a front panel of the fan tray or front panel 30 of the chassis, as described below with respect to FIG. 6.

Figure 3:
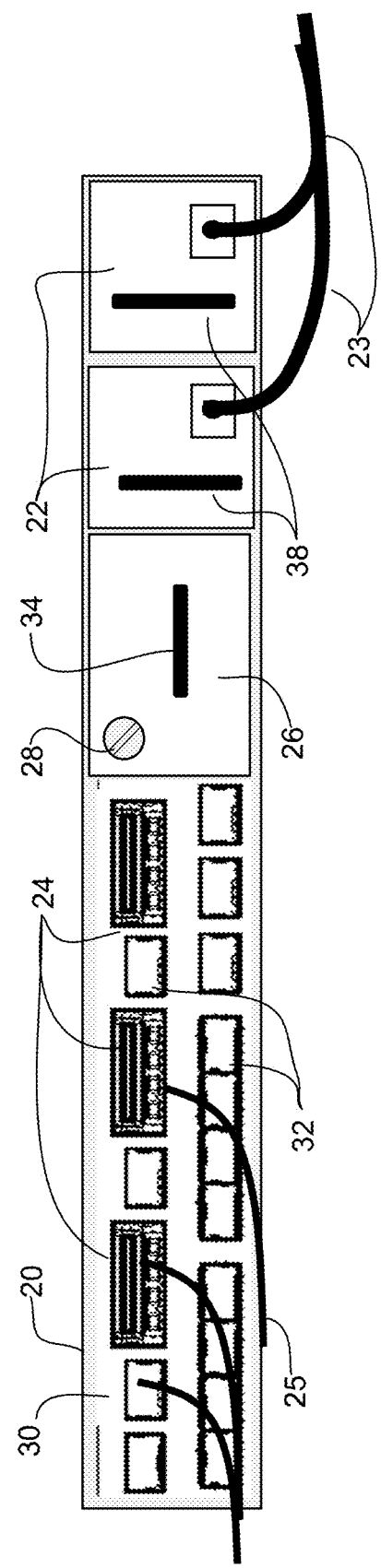
FIG. 3 is a front view of the modular electronic system shown in FIG. 2.

FIG. 3 is a front view of the modular electronic system 20 of FIG. 2. The power supply units 22 and fan tray 26 are inserted into openings in the front panel 30, which also includes openings 24, 32 for receiving optical modules or connectors. The fan tray 26 may include a handle 34 for use in insertion or removal of the fan tray and a thumb screw 28 (or other suitable fastener) for use in securing the fan tray 26 in place in the chassis and providing for easy removal. Similarly, the power supply units 22 may also include handles 38. The front panel 30 may also comprise one or more vents for receiving airflow as shown in FIG. 1. For simplification, the air vents are not shown on the front panel in FIG. 3.

Figure 4:
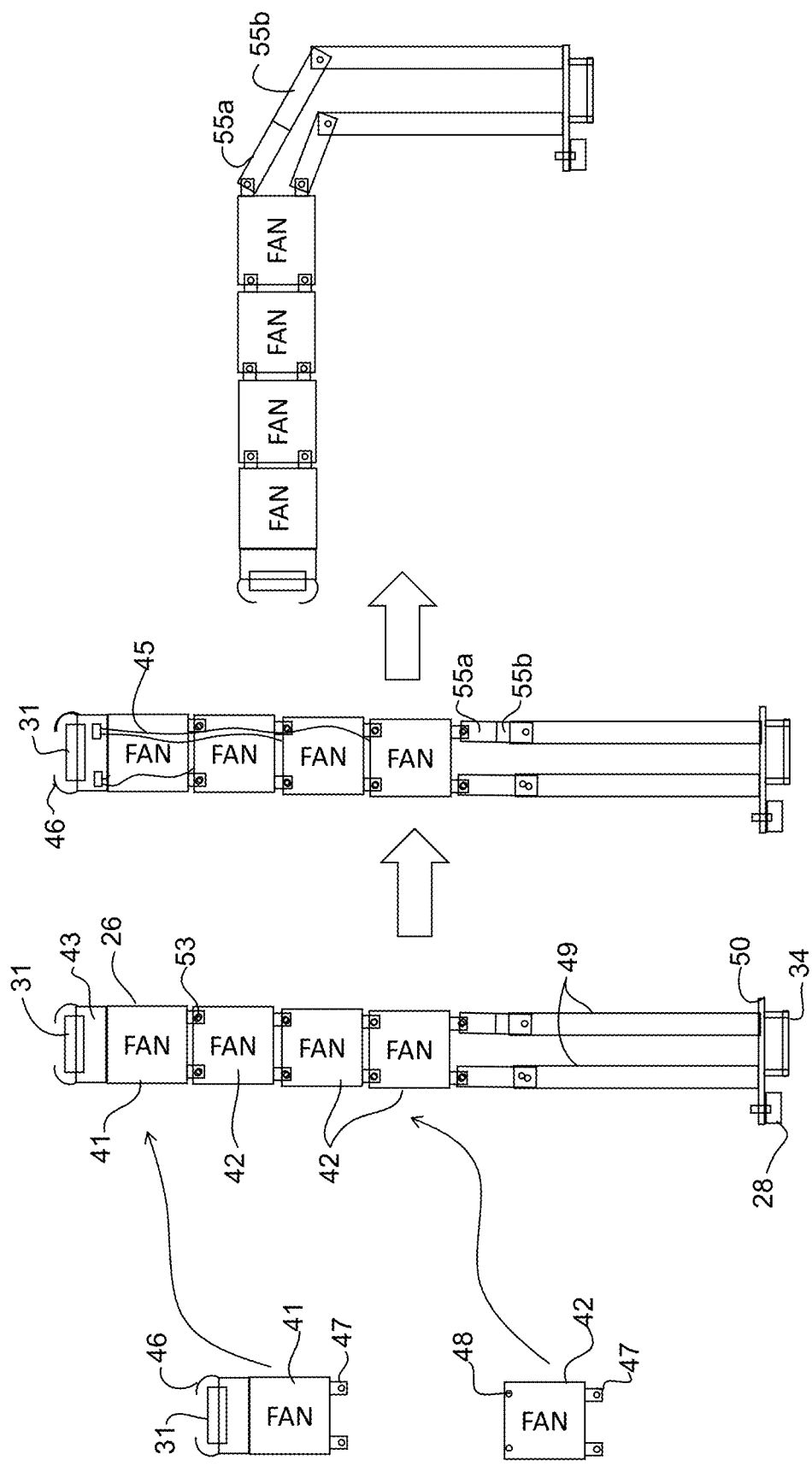
FIG. 4 illustrates components of the fan tray, in accordance with one embodiment.

FIG. 4 is a top view of the flexible fan tray 26 shown in FIG. 2, broken down into components and shown assembled and in an operating position (moving from left to right in FIG. 4). The fan tray 26 comprises a plurality of individual fan units 41, 42. The fan tray 26 is a mechanical arrangement in which each individual fan (fan unit, fan enclosure) 41, 42 is connected to other fans through hinged joints. In the example shown in FIG. 4, the leading edge fan 41 includes a PCBA (printed circuit board assembly) 43 and the interface connector 31 to provide an electrical interface and communications signaling with the equipment. Each individual fan is connected to the PCBA 43 with wired connections 45. The leading edge fan 41 also has a mechanical profile (wire, spring, thin metal member) 46, which not only guides the fan tray 26 through the channel for smooth insertion, but also locks into mating slots at an end of the channel to provide mechanical stability. The profile 46 may be spring loaded to lock in place within slots on the fan tray guide and control insertion depth.

In one or more embodiments, each hinged joint (articulated member) comprises hinge members 47 (e.g., two arms with openings on a fan unit edge as shown in FIG. 4) and holes (openings) 48 on an opposite edge for receiving hinge pins 53 connecting the fan unit to the hinge members of an adjacent fan unit. The hinge pins 53 are received in aligned openings 48 on the fan unit and hinge members 47. The leading edge fan unit 41 includes hinge members 47 and the other fan units 42 each comprise openings 48 on a leading edge and hinge members 47 on a trailing edge. The last fan unit 42 connects to elongated hinge members 49 that connect the fans 41, 42 to a front retaining member 50 of the fan tray. The front retaining member 50 includes the handle 34 and thumb screw 28, as previously described.

In one embodiment, an outer elongated hinge member comprises sliding members 55*a*, 55*b* to allow one member to be slidably received in an adjacent member, thus reducing the length of the hinge member 49 when the fan tray is in a straight insertion position and allowing the length of the member to increase as the fan tray turns through the ninety degree angle to orient the fans generally parallel to the front panel, as previously described with respect to FIG. 2 and shown with the fan tray in its angled position on the right in FIG. 4.

Figure 5:
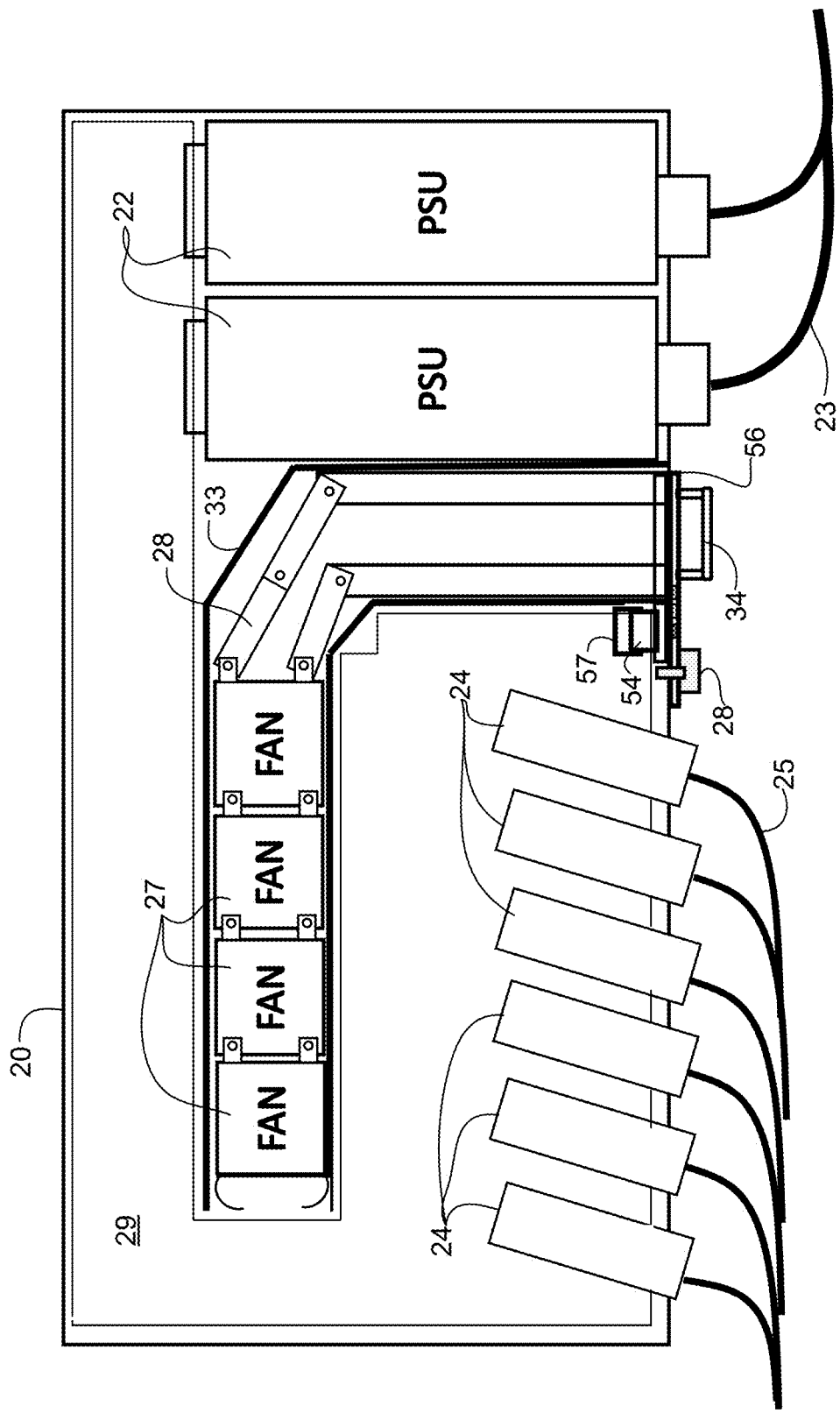
FIG. 5 is a top view of another embodiment of the fan tray installed in the modular electronic system with part of the chassis removed to show detail.
Figure 6:
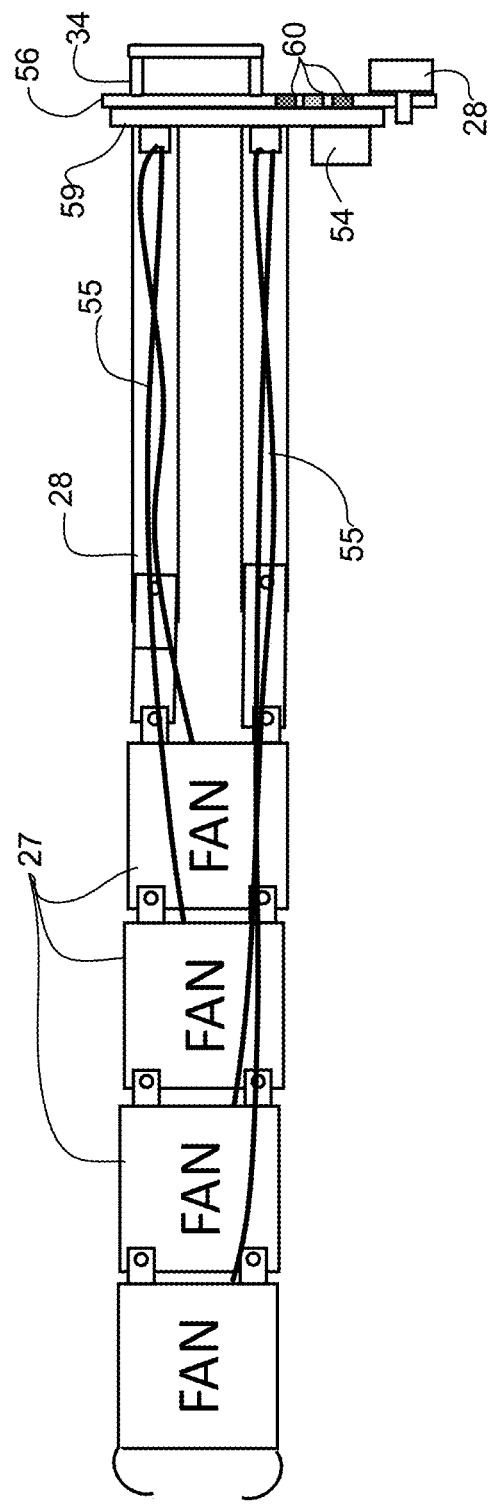
FIG. 6 illustrates details of the fan tray shown in FIG. 5.

FIG. 5 illustrates another embodiment in which a fan tray connector 54 is located at a trailing edge of a fan tray 56 (rather than a leading edge as shown in FIG. 2) and engages along the insertion direction near a front retaining member 57. FIG. 6 illustrates details of the fan tray 56, in accordance with one embodiment. The fans (fan units, fan enclosures) 27 each have a wired connection 55 to a front panel PCB 59 on the fan tray to provide a signal to a fan status indicator 60 on the fan tray front panel. In one or more embodiments, the fan status indicator 60 comprises one or more LED lights (e.g., green light, yellow light, red light) for indicating a status of the fans. Push button detection may be used for fan tray detection and to ensure that the fans are inserted in their correct operating position. The correct location of the fan tray 56 may be indicated by a green light, for example, connected to a push button on the front panel of the fan tray. As previously described, the fan tray 56 includes a handle 34 and fastener 28 on the front panel of the fan tray.

Figure 7:
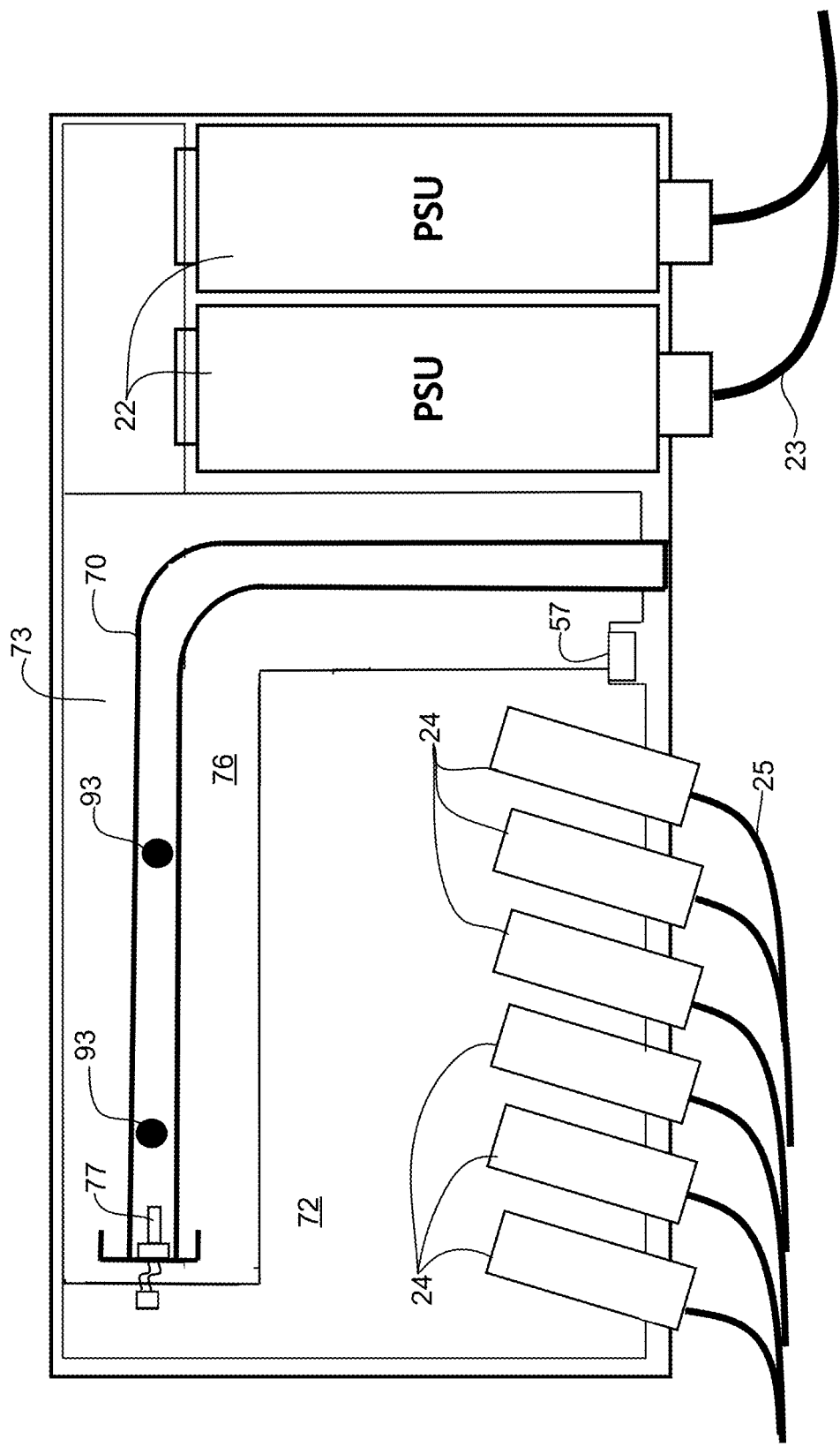
FIG. 7 is a top view of the modular electronic system without the fan tray and part of the chassis removed to show a fan tray guide, in accordance with one embodiment.

FIG. 7 is a top view of the modular electronic system with the fan tray 56 removed to show detail of a fan tray guide 70 located within channel 73 and mounted on a PCB 72. This arrangement allows for a larger PCB area where internal layers can be used for routing. The number of fans may be selected based on the available space and airflow/cooling needs. An insulator 76 may be interposed between the fan tray guide 70 and the PCB surface 72 to prevent an electrical short. As described below with respect to FIG. 8, the guide rail 70 may include one or more spring loaded plungers 93 for use in support and indexing. Connector 57 is shown for interfacing with the trailing edge connector.

FIG. 7 also illustrates a contact button 77 that may be used to indicate proper installation of the fan tray or detect presence of the fan tray. The fan tray contact button 77 engages with a leading edge of the fan tray and may provide a signal, which is communicated to the indicator lights 60 described above with respect to FIG. 6. The signal may also be sent to a fan control module in the network device. The fan tray contact button 77 may help ensure that that the fan tray is properly positioned, which may be indicated, for example, by a green light on the fan tray front panel.

Figure 8:
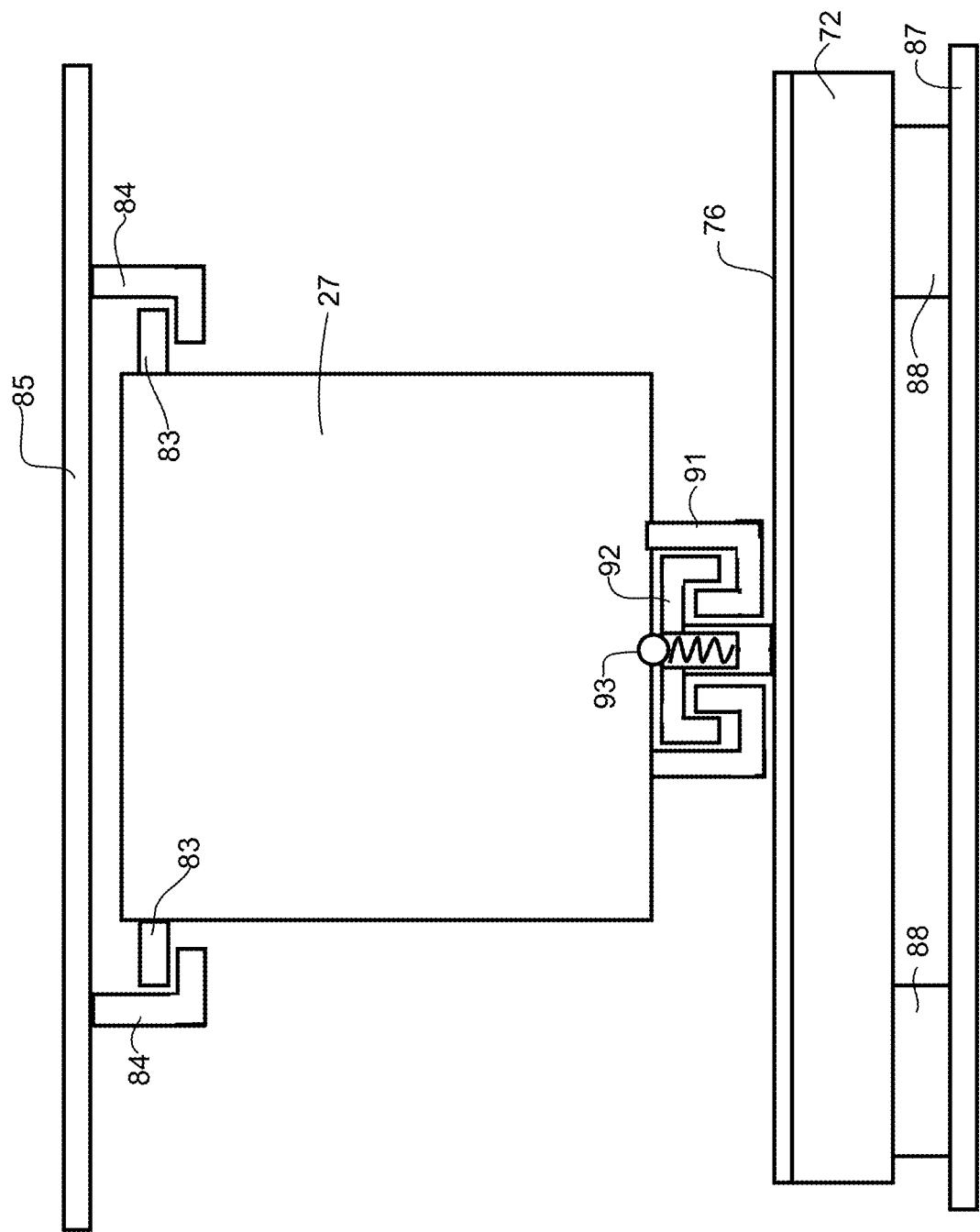
FIG. 8 is a cross-sectional view of the fan tray and fan tray guide, in accordance with one embodiment.

FIG. 8 is a cross-sectional view of a fan tray and guide rail taken through one of the fan tray units 27, in accordance with one embodiment. The fan tray includes a plurality of fan units (fans and fan enclosures) 27, as previously described. The fan tray further includes upper arms 83 slidably engageable with an upper track 84 extending downwardly from a top wall 85 of the chassis. The PCB 72 may be connected to a bottom wall of the chassis through mounting members 88 and insulator 76 may be positioned on top of the PCB to prevent contact between the fan tray and PCB, as described above. A lower fan tray slide member 91 extends from a lower portion of the fan tray for sliding engagement with a bottom rail member 92. In the example shown in FIG. 8, the lower fan tray slide member 91 comprises two longitudinal U-shaped grooves for sliding engagement with a T-shaped bottom rail member 92. In one or more embodiments, the spring loaded ball plunger 93 may be used to provide support and indexing through engagement with an indent (e.g., half-spherical opening) formed along a bottom of the fan tray. The spring loaded ball plunger 93 provides gripping action between parts and may also lock the parts when the spring loaded ball snaps into a mating indent on the fan tray. Any number of spring loaded plungers 93 for engagement with corresponding features on the fan tray may be spaced along the guide rail. All sliding surfaces may be formed with suitable plating or coating to reduce friction between the sliding members. For example, sliding surfaces may include a power or Teflon coating. It is to be understood that the guide rail and fan tray profile shown in FIG. 8 is only an example and that other profiles may be used without departing from the scope of the embodiments. Also the location of the channel and guide rail may be different than shown in FIG. 7. For example, the shape and size may be designed to match the PCB layout and the fan tray positioned to maximize cooling performance.

As described below with respect to FIGS. 17B and 17C, the guide rail may also be positioned on the side wall or top wall, without any portion of the guide rail on the bottom wall, to provide additional space for mounting components on the PCB 72. Thus, the rail shown on a bottom wall in FIG. 8 may be rotated and extend outwardly from a side wall or downwardly from a top wall.

Figure 9:
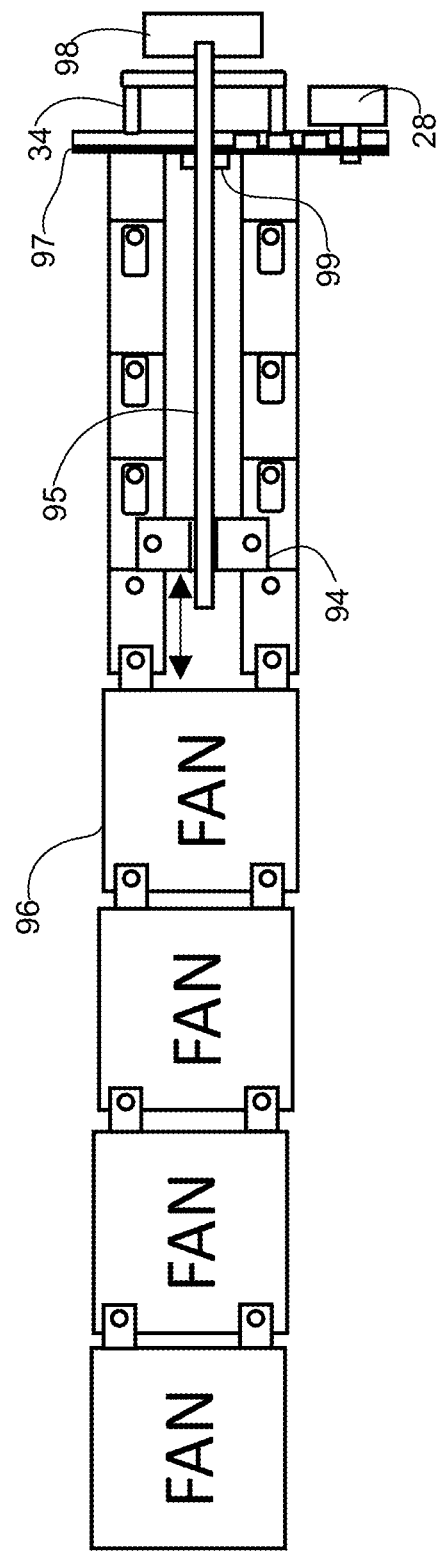
FIG. 9 is a top view of a fan tray with a lead screw adjustment mechanism, in accordance with one embodiment.

FIG. 9 illustrates an example of a lead screw fan tray design, in accordance with one embodiment. A lead screw 95 is inserted into an opening in fan tray front retaining member 97 aligned with nut 99. The lead screw 95 helps with smooth insertion and extraction of the fan tray. The lead screw 95 translates rotational movement to linear movement at ring 94 connected to the hinged members and provides more accurate force to fan tray 96 for use in moving and positioning the fan tray on the guide rails. A combination of collapsible and fixed hinged joints may be used to accommodate needed length of the lead screw. The overall length of the fan tray 96 can be reduced when the collapsible hinged parts are collapsed. As soon as the lead screw 95 is rotated, the hinged parts expand and push the fan tray to its correct position. A recommended value of torque may be provided for the lead screw in hardware installation guides so that the lead screw does not damage any of the mechanical parts.

Figure 10:
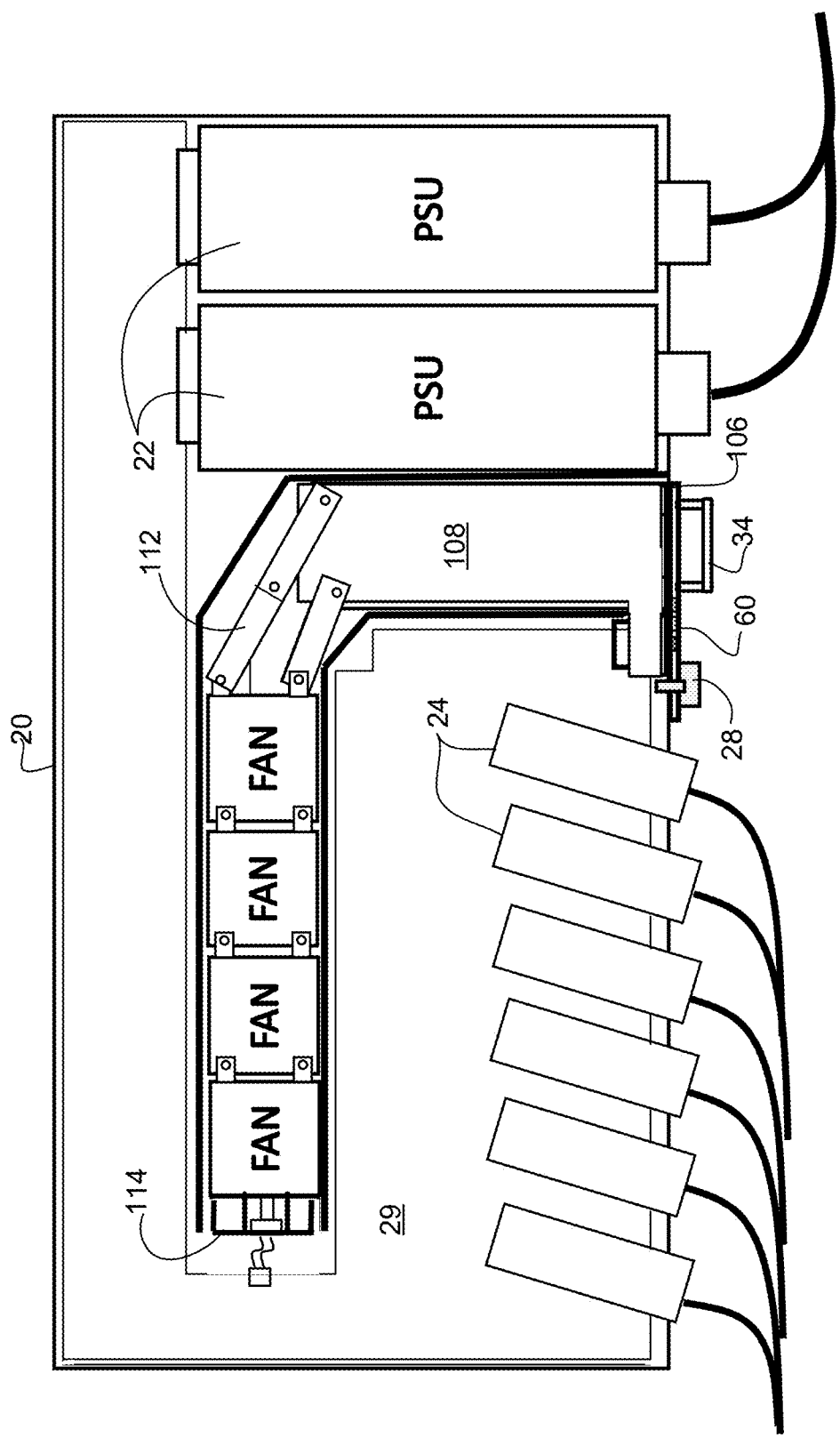
FIG. 10 is a top view of another embodiment of the fan tray with an integrated printed circuit board installed in the modular electronic system with part of the chassis removed to show detail.

FIG. 10 illustrates how a fan tray 106 may be used to provide space for additional components such as a printed circuit board assembly (PCBA) 108 for use in supporting additional electronics. Hinge members 112 may be attached directly to the PCBA 108. FIG. 10 also shows an example of a fan tray stop 114 that may be used for properly positioning the fan tray 106.

Figure 11A:
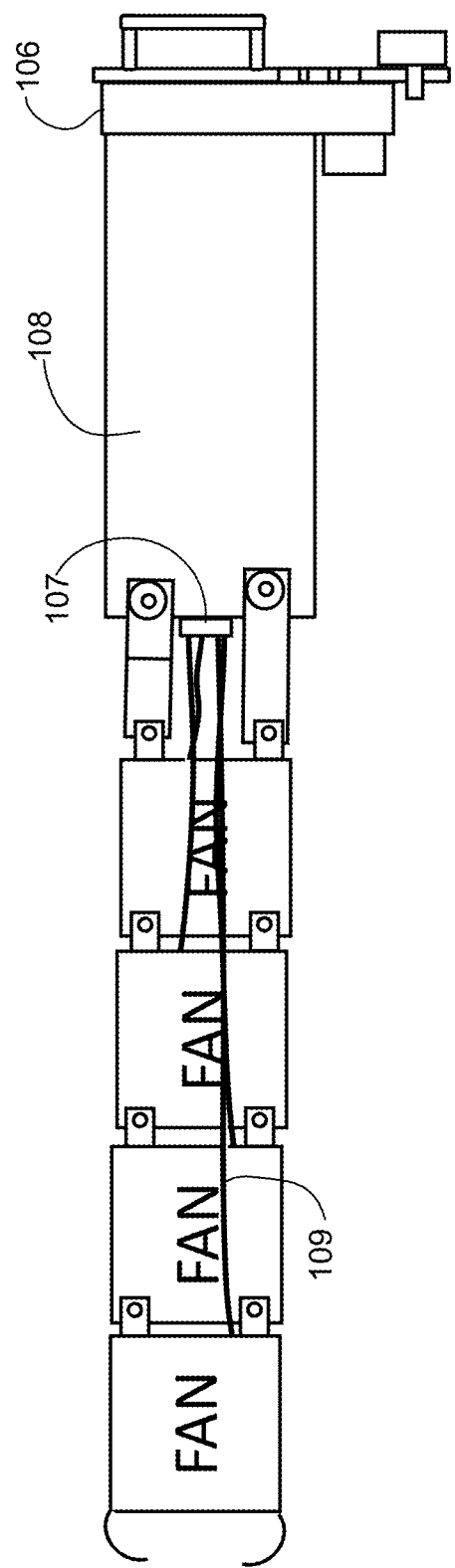
FIG. 11A is a top view of the fan tray shown in FIG. 10.
Figure 11B:
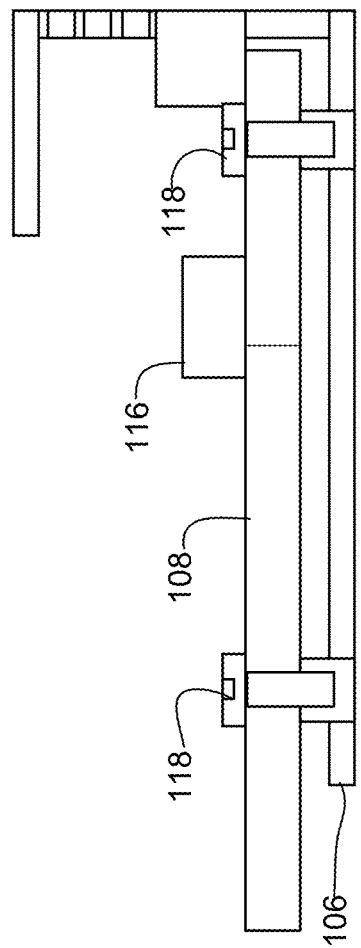
FIG. 11B is a side view of a portion of the fan tray shown in FIG. 11A.

Additional details of the fan tray 106 and PCBA 108 are shown in FIGS. 11A and 11B. FIG. 11A is a top view of the fan tray and FIG. 11B is a side view showing only the PCBA portion of the fan tray. The PCBA 108 may be attached to the fan tray 106 with fasteners 118, for example. One or more electronic components 116 may be mounted on the PCBA 108. Each fan may include a wire 109 connected to the PCBA 108.

Figure 12:
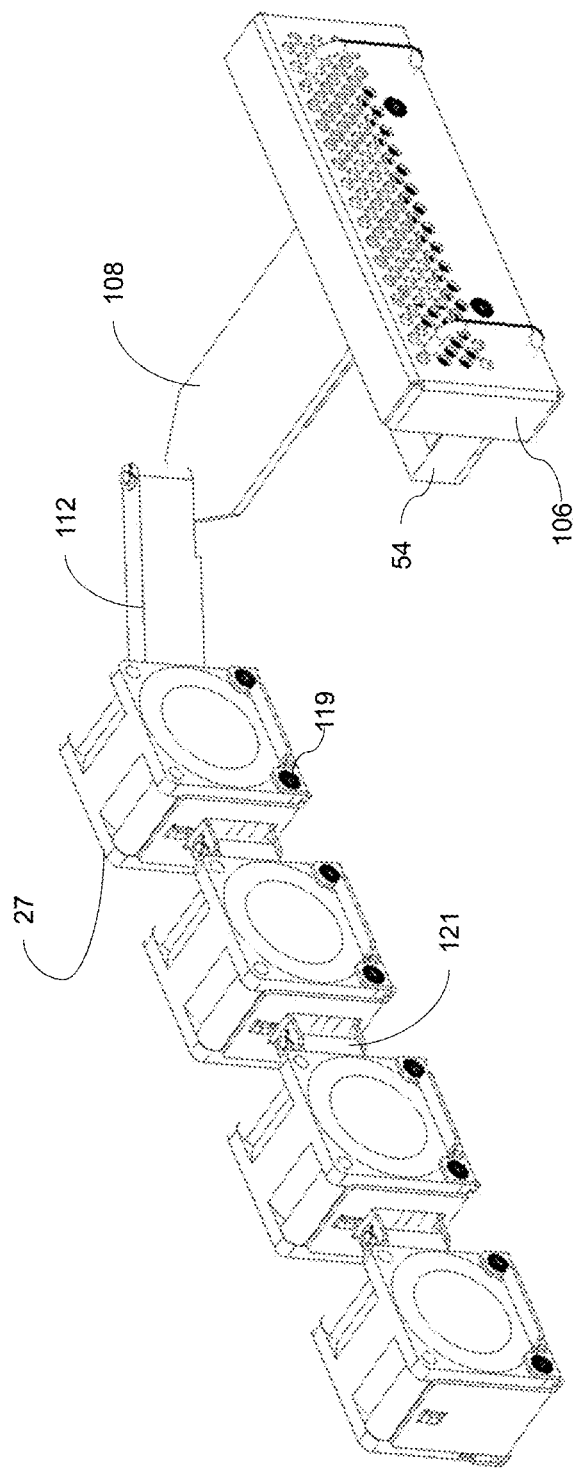
FIG. 12 is a perspective of the fan tray shown in FIG. 10.

FIG. 12 is a perspective of the fan tray 106 shown in FIG. 10. As described above, the fan tray includes the PCB 108 and fan tray connector 54. In this example, the PCB 108 is connected to the fan by hinge 112 and each fan is connected with a hinge joint 121. The distance between the joints is maintained to provide desired rotation during insertion or extraction of the fan tray 106 from the chassis. Each fan 27 may be attached to the fan tray frame with fasteners 119 (e.g., screw or other suitable fastener).

Figure 13:
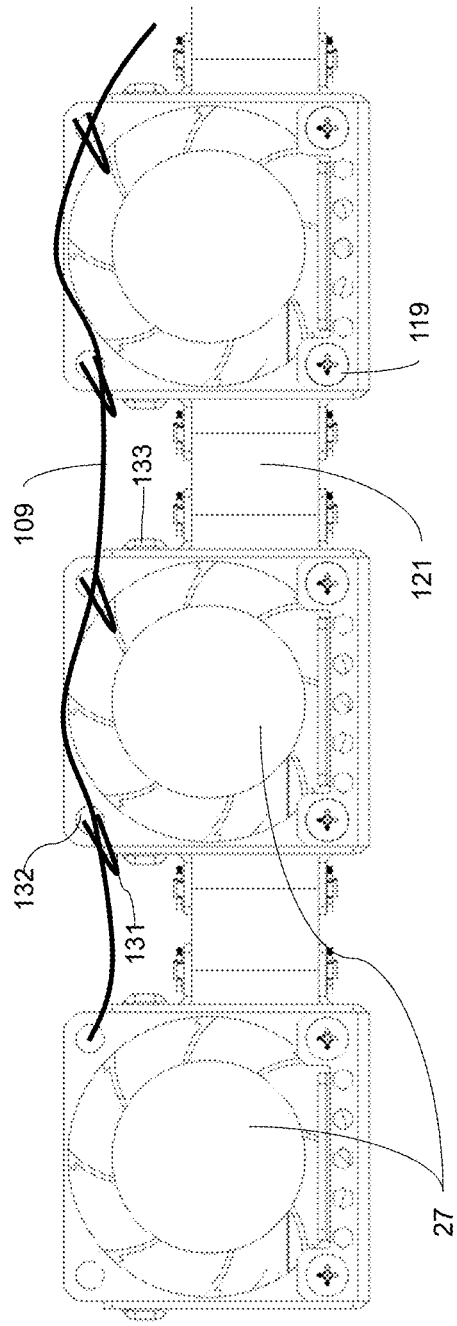
FIG. 13 is a front view of a portion of the fan tray illustrating a fan tray cable routing, in accordance with one embodiment.

FIG. 13 is a front view of a portion of the fan tray illustrating fan tray cabling 109. Sufficient slack is maintained in in the cable 109 so that it does not get stretched during rotation and does not obstruct movement of the fan tray. As previously described, the cable 109 is connected to the fan tray PCB. In one example, the cable 109 is supported by clips (or ties) 131 attached to openings 132 on the fan housing. In another example, the cable 109 may be tied with a cable tie attached to a sheet metal feature 133 on the fan housing.

Figure 14A:
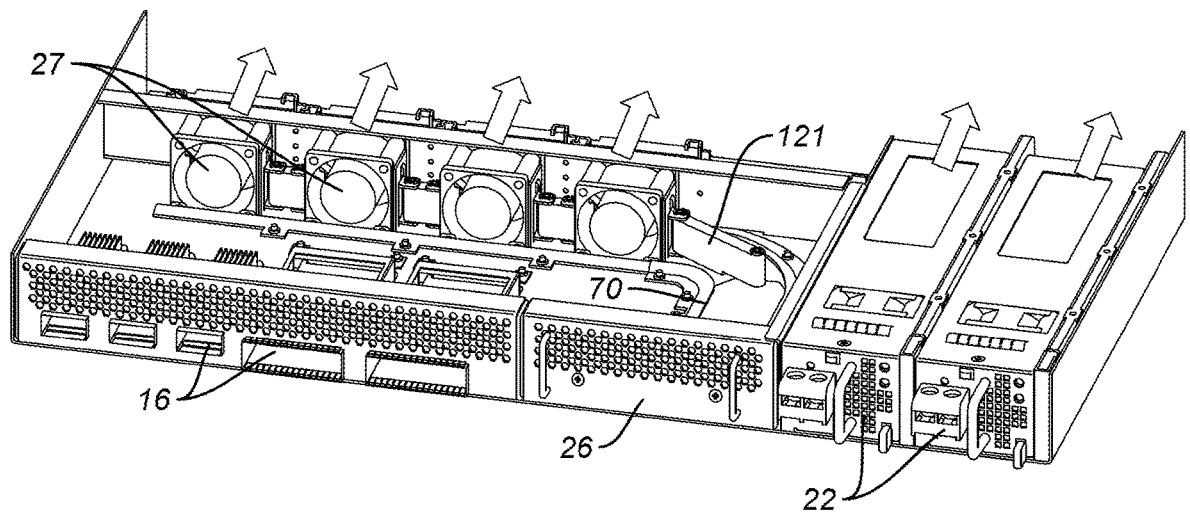
FIG. 14A is a front perspective of the modular electronic system shown in FIG. 1 with a top removed to show detail of the fan tray.

FIG. 14A is a front perspective of the modular electronic system with a top wall removed to show detail. As previously described, the fans 27 draw air through the chassis from front-to-back. The air flow exits the fans 27 as indicated by arrows in FIG. 14A.

Figure 14B:
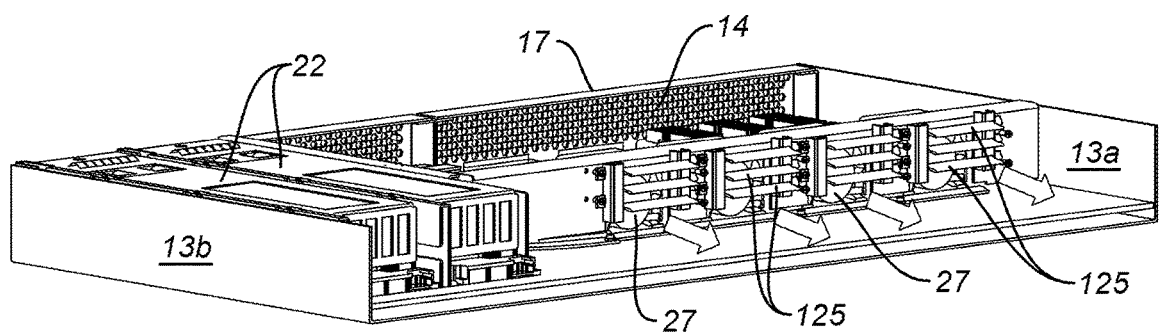
FIG. 14B is a rear perspective of the modular electronic system shown in FIG. 14A.

FIG. 14B is a rear perspective of the modular electronic system shown in FIG. 14A. As previously described, the front panel 17 includes air vents 14. In one or more embodiments, flap doors 125 are located behind the fans 27 to prevent airflow recirculation in the case of fan failure. The flap doors 125 remain open (as shown in FIG. 14B) when the fans are working due to air pressure. If one of the fans 27 fails, the corresponding flap door 125 closes due to gravity and suction on the opposite side. This prevents hot exhaust air from recirculating in the case of a fan failure.

Figure 15:
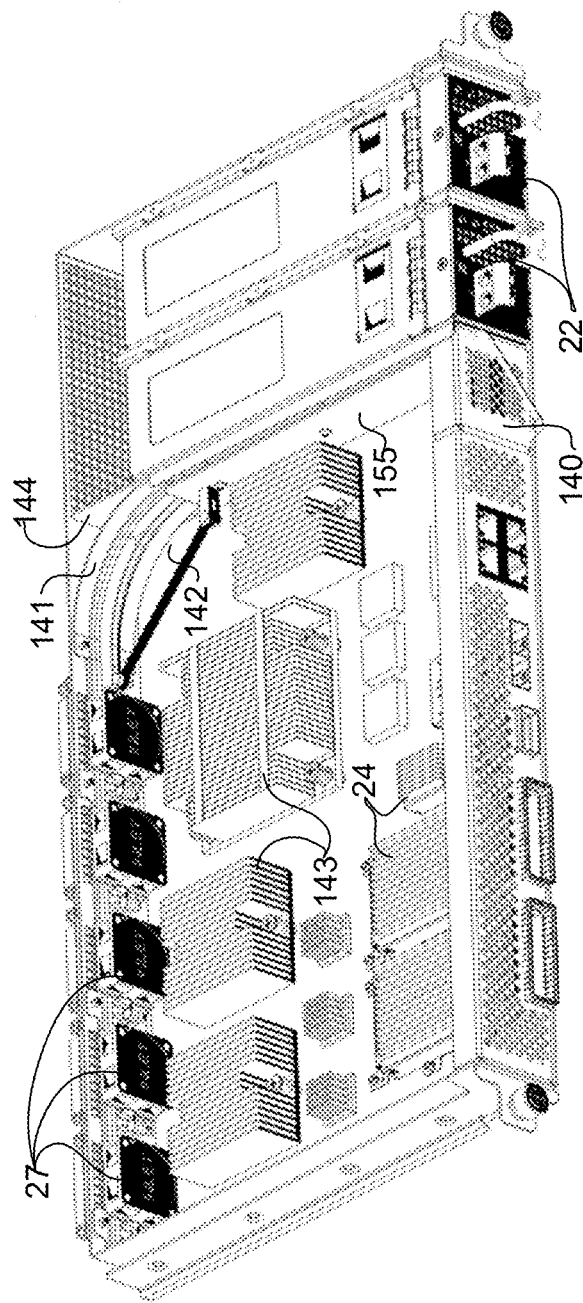
FIG. 15 is a top perspective of the modular electronic system with the top removed to show a fan tray guide rail on a side wall of the channel, in accordance with one embodiment.

FIG. 15 is a top perspective of another embodiment of the modular electronic system. The modular electronic system may include any number of heat sinks 143 on high power dissipating components. As shown in FIG. 15, a fan tray guide 141 is positioned along a side wall within channel 142. The channel (or path) is defined by the side guide rail 144 and an open area that allows for movement of the fan tray and fans 27 through the modular electronic system. The path 142 may pass over the PCB, since there is no need to provide space in the PCB for the side mounted fan tray guide 141. In this example, the fan tray 140 and fans 27 slide on a side wall adjacent to the power supply units 22 and rear wall of the chassis. Since the fan tray guide 141 is on a side wall of the channel, there is no need for a cutout in the system PCB, thus maximizing PCB area and providing improved component density. A vertical fan tray PCB 155 may be included in the fan tray 140 to provide additional PCB space for component placement and routing. The vertical fan tray PCB 155 slides along the same fan tray guide 141. In one example, the fans 27 and PCB 155 of the fan tray 140 may slide between a pair of guide rails. The guide rails of the fan tray guide 141 may include perforations to minimize airflow resistance during operation. In one or more embodiments, a single system PCB may be used without any additional backplane to connect different module components. An airflow partition 144 may be provided to separate power supply and system airflow. In the example shown in FIG. 15, five fans 27 are provided to cool the high power optical transceivers 24.

The positioning of the fans allows for a higher number of fans than conventional front accessible fan trays, which are limited by the depth of the modular electronic system. Fan size may be selected based on system cooling requirements and options may include, for example, double rotor fans or fans in series to provide improved performance within the allotted channel size. If needed, a larger thickness PCB may be milled in the area of tray movement (within the channel or path) with the remaining layers still used for routing. In one or more embodiments, efficient cable management is provided without any interference with modular components and separate routing for signal and power cables (e.g., optical fibers route to the left and power cables route to the right as viewed in FIG. 15). The fan tray cables may be routed as described above with respect to FIG. 13 and connected to a fan connector located on the fan tray PCB 155, for example.

Figure 16:
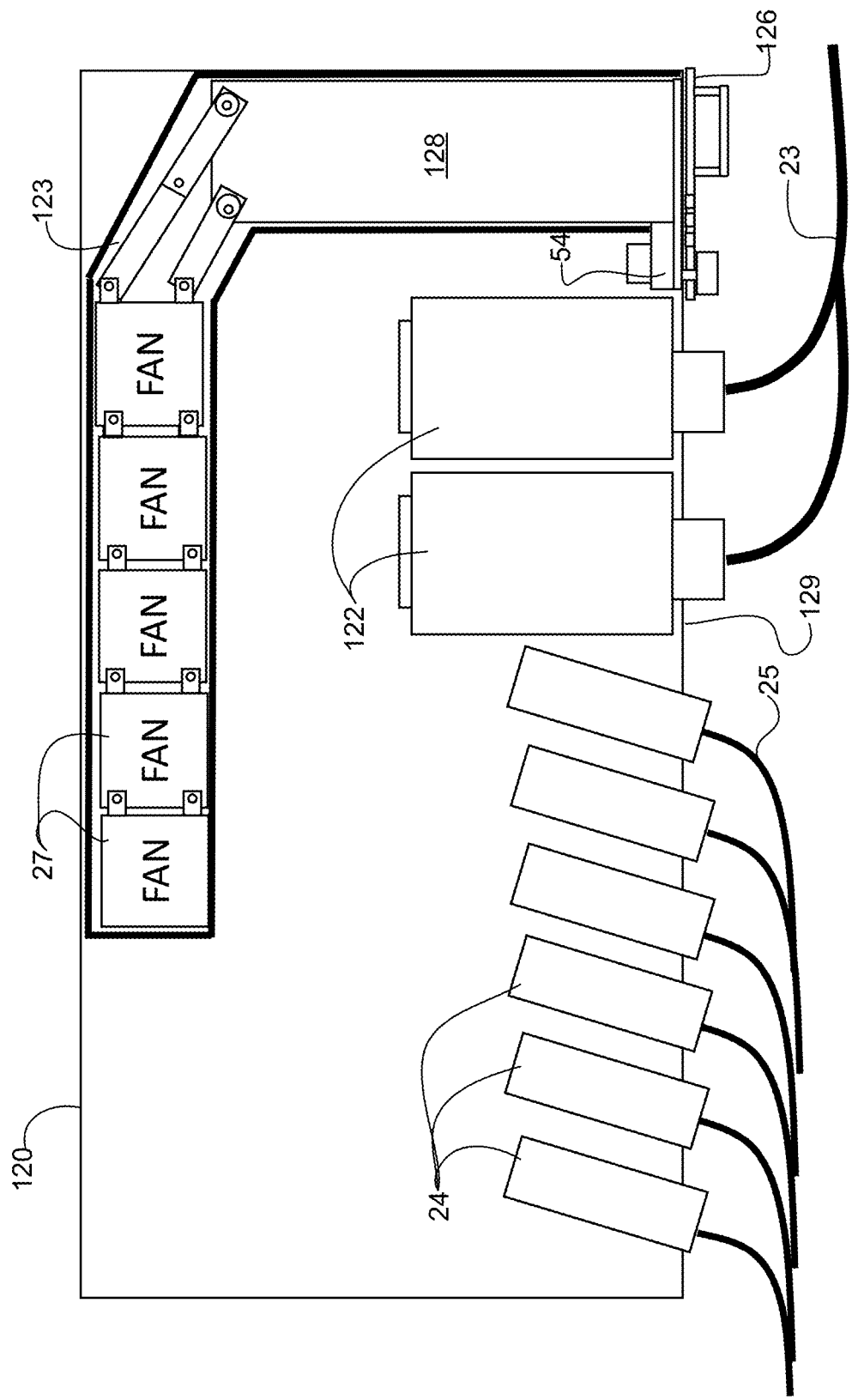
FIG. 16 is a top view of another embodiment of a fan tray installed in the modular electronic system for cooling optical modules and power supply units.

FIG. 16 illustrates another embodiment in which a fan tray 126 is inserted along one edge of a modular electronic system 120 to provide cooling to the optical modules 24 and power supply units (e.g., PSU or PoE modules) 122. As previously described, the fan tray 126 may include a PCBA 128 (e.g., CPU (Central Processing Unit) or electronic components). This embodiment eliminates the need for individual fans for each power supply unit 122. As shown in FIG. 16, channel 123 extends from an opening in front panel 129 to a back portion of the chassis located behind both the power supply units 122 and optical modules 24. In this example, the fan connector 54 is located at the trailing edge, but the connector may also be located at the leading edge of the fan tray, as described above with respect to FIG. 2.

Figure 17A:
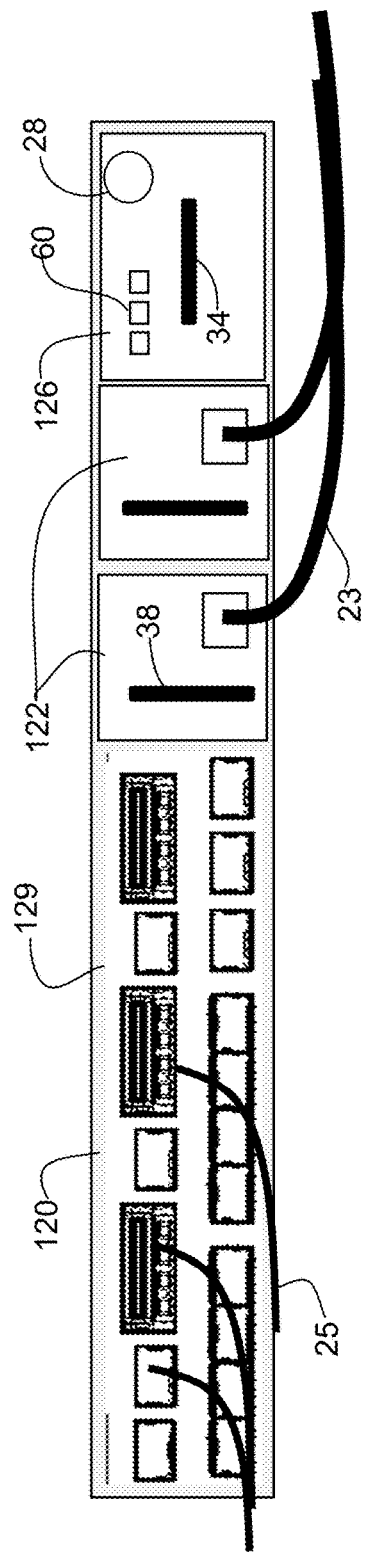
FIG. 17A is a front view of the modular electronic system and fan tray of FIG. 16.
Figure 17B:
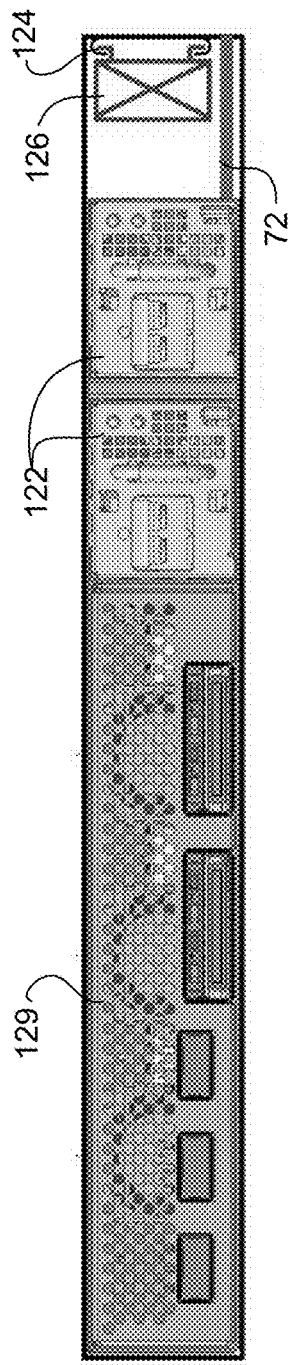
FIG. 17B is a front view of the modular electronic system of FIG. 17A with a portion removed to show the fan tray with guide rails on a side wall.
Figure 17C:
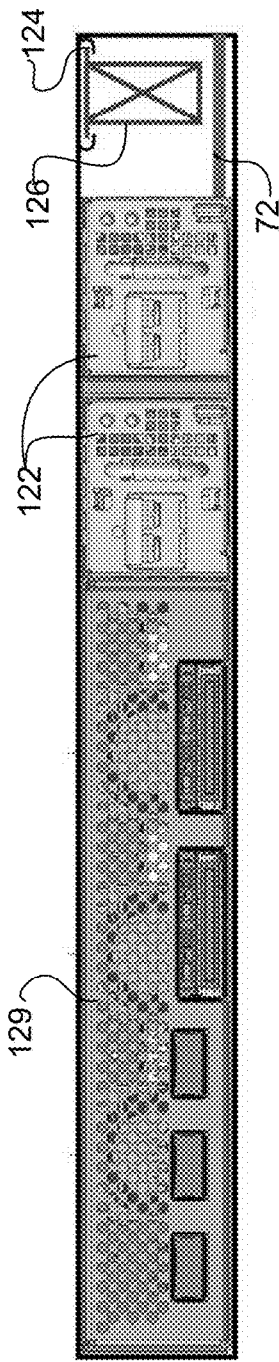
FIG. 17C is a front view of the modular electronic system of FIG. 17A with a portion removed to show the fan tray with guide rails on a top cover.

FIG. 17A is a front view of the modular electronic system 120 and fan tray 126 shown in FIG. 16. For simplification, air vents are not shown in FIG. 17A. FIGS. 17B and 17C are front views of the modular electronic system shown in FIG. 16 with a front face of the fan tray removed to show details of a guide rail 124. In FIG. 17B the fan tray 126 slides on the guide rail 124 positioned on an internal side wall of the chassis. FIG. 17C shows the fan tray 126 slidably received in guide rail 124 positioned on an internal surface of a top cover of the chassis. Positioning of the guide rail 124 on the side wall or top cover eliminates the need to provide an opening in the PCB 72 extending along the bottom of the chassis, which provides more space for component placement and routing layers.

Figure 18:
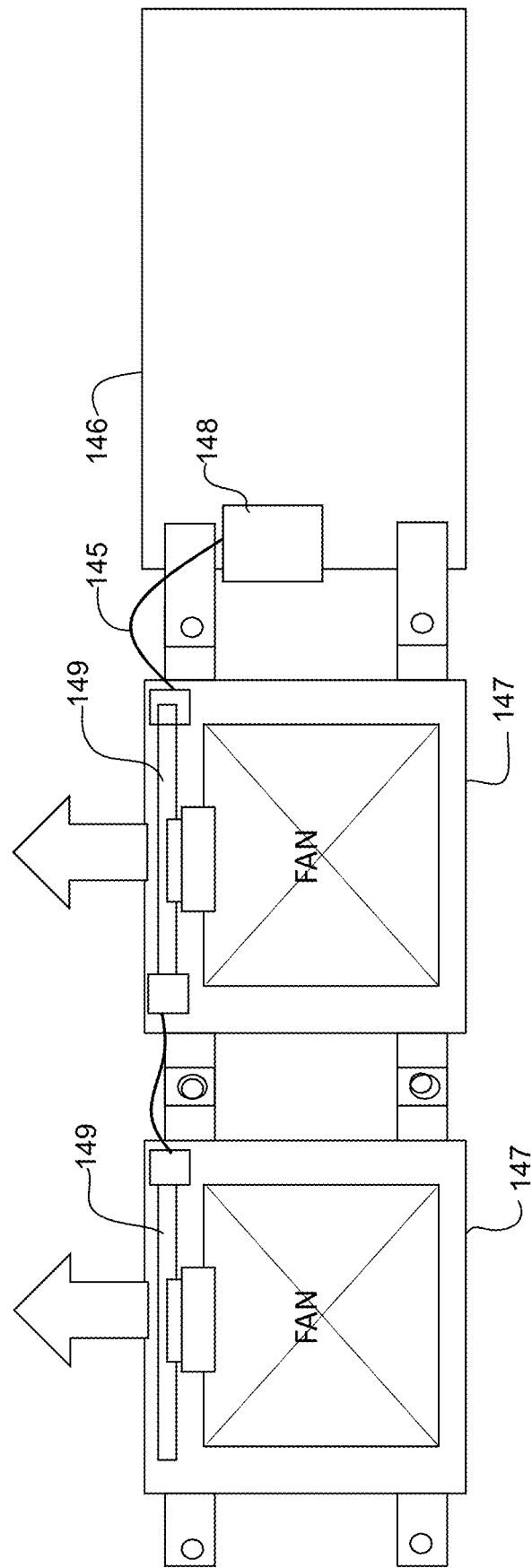
FIG. 18 is a top view of another embodiment of the fan tray with integrated printed circuit boards.

FIG. 18 is a top view of a portion of a fan tray 146 illustrating electrical connections for each fan 147. Wire 145 extends from a connector 148 on the fan tray 146 to each of the fans 147 through a PCB 149 located on each fan unit 147. Each PCB 149 on the fan units 147 may include a cutout to allow airflow to pass therethrough.

Figure 19A:
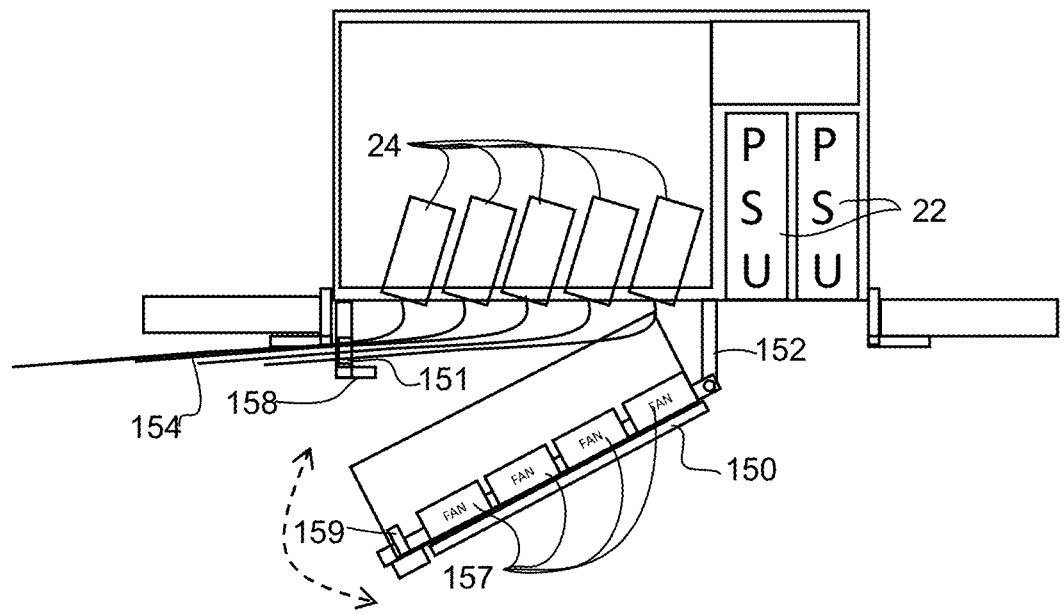
FIG. 19A is a top view of a hinged fan tray connected to the modular electronic system and shown in an open position with part of the chassis removed to show detail, in accordance with one embodiment.
Figure 19B:
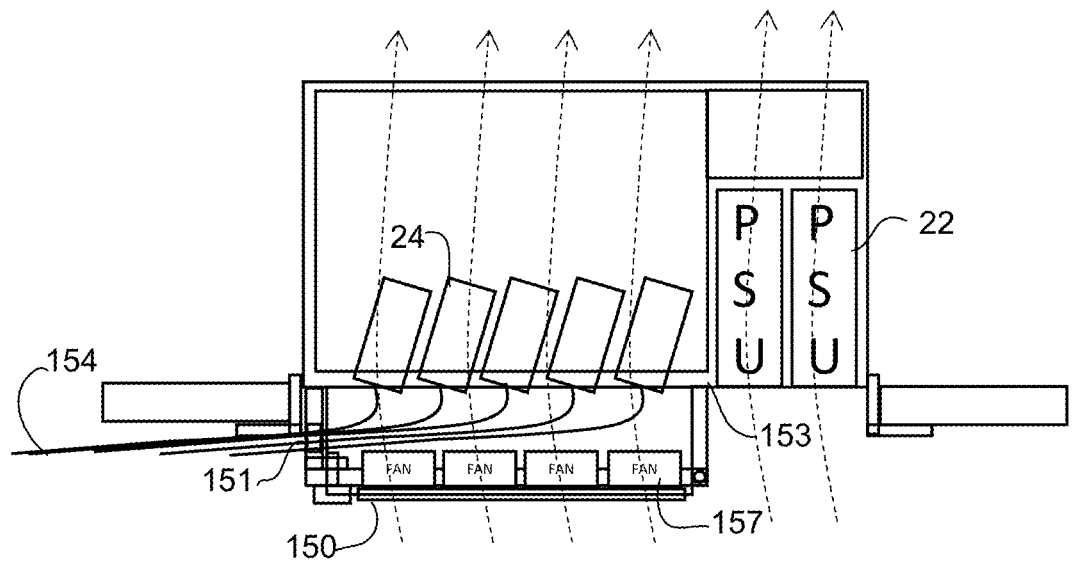
FIG. 19B is a top view of the hinged fan tray of FIG. 19A in a closed position showing airflow through the modular electronic system.

FIGS. 19A and 19B illustrate another fan tray embodiment that also provides front access and front-to-back airflow. In this embodiment, an entire fan tray enclosure 150 is connected through a hinged joint 152 external to a front panel 153 of the modular electronic system. In order to access the front panel 153 of the system, the fan tray 150 is moved away as shown in FIG. 19A. FIG. 19B illustrates the fan tray 150 positioned for operation and shows the direction of the front-to-back airflow past the optical modules 24 and through the power supply units 22.

The fan tray 150 may also include an air filter and allows for replacement of individual fans 157. The optical transceivers 24 are exposed directly to the fans 157, thus providing improved cooling. The mechanical enclosure, including exit gland 151 for passing through cables 154, is preferably sealed to prevent cooling air leakage. As shown in FIGS. 19A and 19B, a locking mechanism comprises member 158 extending from the front panel 153 of the chassis that interlocks with fingers 159 on the fan tray enclosure. Various locking mechanisms may be used to hold the fan tray enclosure 150 in position against the chassis.

Figure 20:
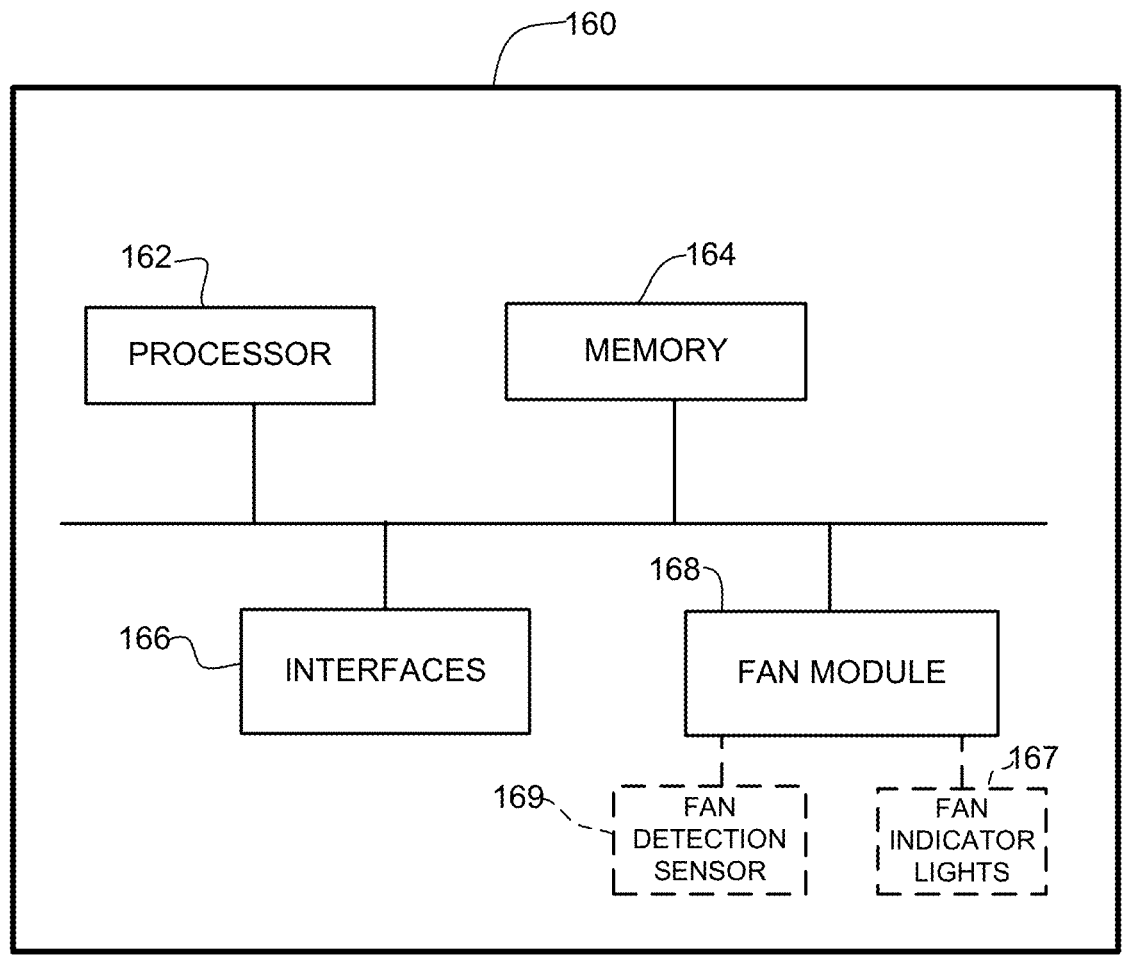
FIG. 20 illustrates a network device in which the embodiments described herein may be implemented.

FIG. 20 illustrates an example of a network device 160 (e.g., modular electronic system 10, 20, 120) that may be used to implement the embodiments described herein. In one embodiment, the network device 160 is a programmable machine that may be implemented in hardware, software, or any combination thereof. The network device 160 includes one or more processor 162, memory 164, network interfaces 166, and fan module (controller, manager) 168.

Memory 164 may be a volatile memory or non-volatile storage, which stores various applications, operating systems, modules, and data for execution and use by the processor 162. For example, components of the fan control module 168 (e.g., code, logic, software, firmware, etc.) may be stored in the memory 164. The network device 160 may include any number of memory components.

Logic may be encoded in one or more tangible media for execution by the processor 162. For example, the processor 162 may execute codes stored in a computer-readable medium such as memory 164. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The network device 160 may include any number of processors 162.

The fan module 168 may comprise one or more components (software, code, logic) operable to monitor fan tray presence through input received from fan detection sensor 169 (e.g., button 77 located at leading edge of fan tray guide in FIG. 7) and provide an output signal to fan indicator lights 167 (e.g., lights 60 in FIG. 6) to provide information or status of the fan tray.

The network interfaces 166 may comprise any number of interfaces (connectors, line cards, ports) for receiving data or transmitting data to other devices. The network interface 166 may include, for example, an Ethernet interface or an optical transceiver for connection to a computer or network.

It is to be understood that the network device 160 shown in FIG. 20 and described above is only an example and that different configurations of network devices may be used. For example, the network device 160 may further include any suitable combination of hardware, software, algorithms, processors, devices, components, or elements operable to facilitate the capabilities described herein.

As can be observed from the foregoing, the embodiments described herein provide numerous advantages. For example, in one or more embodiments, no additional rack space is needed as there is no additional accessory needed to convert airflow direction or allow for insertion of the fans since they are internal to the system. Also, the field replaceable modules are all front accessible, thus making replacement easier. The equipment may be deployed in a closed cabinet, with a cabinet or rack positioned against a wall, or in a back-to-back arrangement. In one or more embodiments, optical transceiver cables (fibers) and power cables may exit in separate directions, making the fan tray easily accessible. In one or more embodiments, flow distribution is uniform due to the front-to-back airflow, which provides optimum cooling to the optical transceivers or other optical or electrical modules. Also, all of the mechanical parts may be optimized for smooth insertion and removal of the fan tray. These additional features may provide a smooth ninety degree transition and also keeps the fan tray locked on the card guides.

In one or more embodiments, all modules are front accessible, making it easier to access all modular parts and an optimum front panel layout is provided with maximum port density and no interference with cable management. One or more embodiments may provide optimized flow distribution and better cooling, thus allowing for high power optics to be managed effectively. One or more mechanical features may be designed to maintain the fan tray properly aligned and locked in place (e.g., guide pins, slide guides, captive screws), which may be optimized for smoother insertion/extraction of the fan tray.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. A modular electronic system comprising:
a front panel comprising openings for receiving a plurality of modules;
a removable fan tray comprising a plurality of fans for cooling one or more of the modules with airflow entering the modular electronic system at the front panel when the plurality of fans are operating; and
a fan tray channel for receiving the fan tray and positioning the fans in a row generally parallel to the front panel;
wherein said fan tray channel extends from one of said openings in the front panel and is contained within a horizontal plane in the modular electronic system; and
wherein the fan tray comprises a printed circuit board assembly operable to support electronic components.

2. The modular electronic system of claim 1 wherein said channel comprises a first portion extending generally perpendicular to the front panel and a second portion extending generally parallel to the front panel.

3. The modular electronic system of claim 2 wherein said first portion of the channel is interposed between at least two of the modules.

4. The modular electronic system of claim 1 wherein the fan tray comprises a plurality of hinged joints providing flexibility for movement of the fan tray within said channel to an operating position.

5. The modular electronic system of claim 1 wherein the fan tray comprises a hinge member slidably receivable within an adjacent hinge member to vary a length of coupled hinge members as the fan tray moves through a turn within said channel.

6. The modular electronic system of claim 1 wherein the fan tray guide is located on a rear wall of a chassis of the modular electronic system.

7. The modular electronic system of claim 1 wherein the fans are positioned behind a plurality of pluggable optical transceivers.

8. The modular electronic system of claim 1 wherein the fan tray comprises a connector located at a leading edge or a trailing edge of the fan tray for receiving power.

9. The modular electronic system of claim 1 wherein the fan tray comprises a fan status indicator on a front face of the fan tray.

10. The modular electronic system of claim 1 wherein the fans are positioned behind at least one power supply unit for cooling the power supply unit.

11. The modular electronic system of claim 1 wherein the fan tray comprises a lead screw for positioning the fan tray within said channel.

12. The modular electronic system of claim 1 wherein the fan tray guide extends downwardly from the top wall for supporting arms extending from the fan tray.

13. The modular electronic system of claim 1 further comprising a partition between an airflow for one or more power supply units and an airflow for optical components.

14. The modular electronic system of claim 1 further comprising flap doors positioned adjacent to an exhaust of the fans and operable to open for exhaust of said airflow, the flap doors comprising generally horizontally extending panels configured to close at least in part due to gravity upon failure of an aligned fan.

15. A modular electronic system comprising:
a chassis for supporting a plurality of optical modules;
a front panel comprising openings for receiving said plurality of pluggable optical modules, at least one power supply unit, and a flexible fan tray;
a path located in a horizontal plane of the chassis and comprising a first portion extending from one of said openings in the front panel and a second portion extending generally parallel to the front panel; and
a fan tray guide mounted within said path on a printed circuit board and comprising an upper track and a lower rail, wherein the lower rail has a width smaller than the upper track to provide space for mounting components on the printed circuit board;
wherein said path is configured for receiving the flexible fan tray comprising a plurality of fans for cooling the optical modules with airflow from a front of the modular electronic system towards a back of the modular electronic system when the fans are positioned in said second portion of said path.

16. The modular electronic system of claim 15 wherein said second portion of said path is located behind the optical modules and the power supply unit for cooling the optical modules and the power supply unit.

17. The modular electronic system of claim 15 wherein the fan tray guide has a width smaller than the flexible fan tray.

18. The modular electronic system of claim 15 further comprising a spring loaded ball plunger for use in support and indexing of the flexible tray, wherein the spring loaded ball plunger provides indexing through engagement with the lower rail mounted within the chassis.

19. The modular electronic system of claim 15 wherein the flexible fan tray comprises arms extending outwardly therefrom and slidably engageable with the upper track, and a slide member extending from a lower portion of the flexible fan tray for sliding engagement with the lower rail.

* * * * *